(12) United States Patent
Sugimachi et al.

(10) Patent No.: US 11,710,683 B2
(45) Date of Patent: Jul. 25, 2023

(54) HEAT CONDUCTION PATTERN FOR COOLING A POWER MODULE

(71) Applicant: Mitsubishi Electric Corporation, Tokyo (JP)

(72) Inventors: Seiya Sugimachi, Tokyo (JP); Kazufumi Oki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 55 days.

(21) Appl. No.: 17/372,127

(22) Filed: Jul. 9, 2021

(65) Prior Publication Data

US 2022/0208663 A1 Jun. 30, 2022

(30) Foreign Application Priority Data

Dec. 24, 2020 (JP) .................................. 2020-215215

(51) Int. Cl.
*H01L 23/495* (2006.01)
*H01L 23/00* (2006.01)
*H02P 29/68* (2016.01)
*H02P 27/08* (2006.01)

(52) U.S. Cl.
CPC .... *H01L 23/49568* (2013.01); *H01L 23/4952* (2013.01); *H01L 23/49562* (2013.01); *H01L 23/49575* (2013.01); *H01L 24/48* (2013.01); *H01L 24/49* (2013.01); *H01L 2224/48247* (2013.01); *H01L 2924/13064* (2013.01); *H01L 2924/13091* (2013.01); *H02P 27/08* (2013.01); *H02P 29/68* (2016.02)

(58) Field of Classification Search
CPC ........... H01L 23/4952; H01L 23/49562; H01L 23/49575; H01L 23/34; H01L 24/48; H01L 24/49; H01L 2924/13064; H01L 2924/13091; H01L 2224/48247
See application file for complete search history.

(56) References Cited

U.S. PATENT DOCUMENTS

| 9,224,670 B2 * | 12/2015 | Kaeriyama | ........... H01L 23/645 |
| 2014/0124890 A1 * | 5/2014 | Fernando | ................ H01L 23/34 257/467 |
| 2015/0035586 A1 * | 2/2015 | Weis | ................... H03K 17/6871 327/427 |
| 2015/0115324 A1 * | 4/2015 | Otremba | ............. H01L 21/8258 257/329 |

FOREIGN PATENT DOCUMENTS

JP          2011-199150 A          10/2011

* cited by examiner

*Primary Examiner* — Alonzo Chambliss
(74) *Attorney, Agent, or Firm* — Studebaker & Brackett PC

(57) ABSTRACT

A semiconductor module includes: a switching device including a gate pad; an output unit including an output pad connected with the gate pad of the switching device through a wire and outputting a drive signal from the output pad to the switching device; a temperature protection circuit detecting temperature and performing protection operation; and a heat conduction pattern connected with the output pad, extending from the output pad toward the temperature protection circuit, and conducting heat generated at the switching device to the temperature protection circuit.

6 Claims, 8 Drawing Sheets

HEAT CONDUCTION PATTERN FOR COOLING A POWER MODULE

BACKGROUND OF THE INVENTION

Field

The present disclosure relates to a semiconductor module and an electrical power conversion device that are each configured to detect temperature and perform protection operation.

Background

A recent low-voltage integrated circuit (LVIC) mounted on an inverter module has a temperature detection function for overheating protection. Heat generated inside the module is mainly generated at an IGBT chip. The heat generated at the IGBT chip reaches a temperature protection circuit of the LVIC through a metal frame and sealing molding resin (refer to JP 2011-199150 A, for example). The temperature protection circuit is a protection function essential for a phenomenon, such as overload operation of a motor or failure of a cooling fan, in which module temperature relatively and slowly increases.

SUMMARY

However, in transient operation, such as motor lock operation or short-circuit operation, in which a junction temperature $T_j$ of the IGBT chip abruptly increases, temperature deviation occurs between the temperature $T_j$ and a temperature $T_{lvic}$ of the temperature protection circuit. Accordingly, temperature protection becomes insufficient, which has been a problem.

The present disclosure is intended to solve the above-described problem and obtain a semiconductor module and an electrical power conversion device that can each achieve sufficient temperature protection.

A semiconductor module according to the present disclosure includes: a switching device including a gate pad; an output unit including an output pad connected with the gate pad of the switching device through a wire and outputting a drive signal from the output pad to the switching device; a temperature protection circuit detecting temperature and performing protection operation; and a heat conduction pattern connected with the output pad, extending from the output pad toward the temperature protection circuit, and conducting heat generated at the switching device to the temperature protection circuit.

In the present disclosure, the heat conduction pattern extending from the output pad toward the temperature protection circuit is provided to conduct heat generated at the switching device to the temperature protection circuit. Accordingly, the temperature of the temperature protection circuit follows transient change of the temperature of each of the switching device, and as a result, the temperature protection circuit can accurately sense abrupt increase of the temperature of the switching device. Thus, it is possible to achieve sufficient temperature protection and prevent breakdown of the semiconductor module even in an operation mode, such as motor lock operation or short-circuit operation, in which the temperature of the switching device steeply increases.

Other and further objects, features and advantages of the invention will appear more fully from the following description.

DESCRIPTION OF EMBODIMENTS

A semiconductor module and an electrical power conversion device according to the embodiments of the present disclosure will be described with reference to the drawings. The same components will be denoted by the same symbols, and the repeated description thereof may be omitted.

First Embodiment

Figure 1:
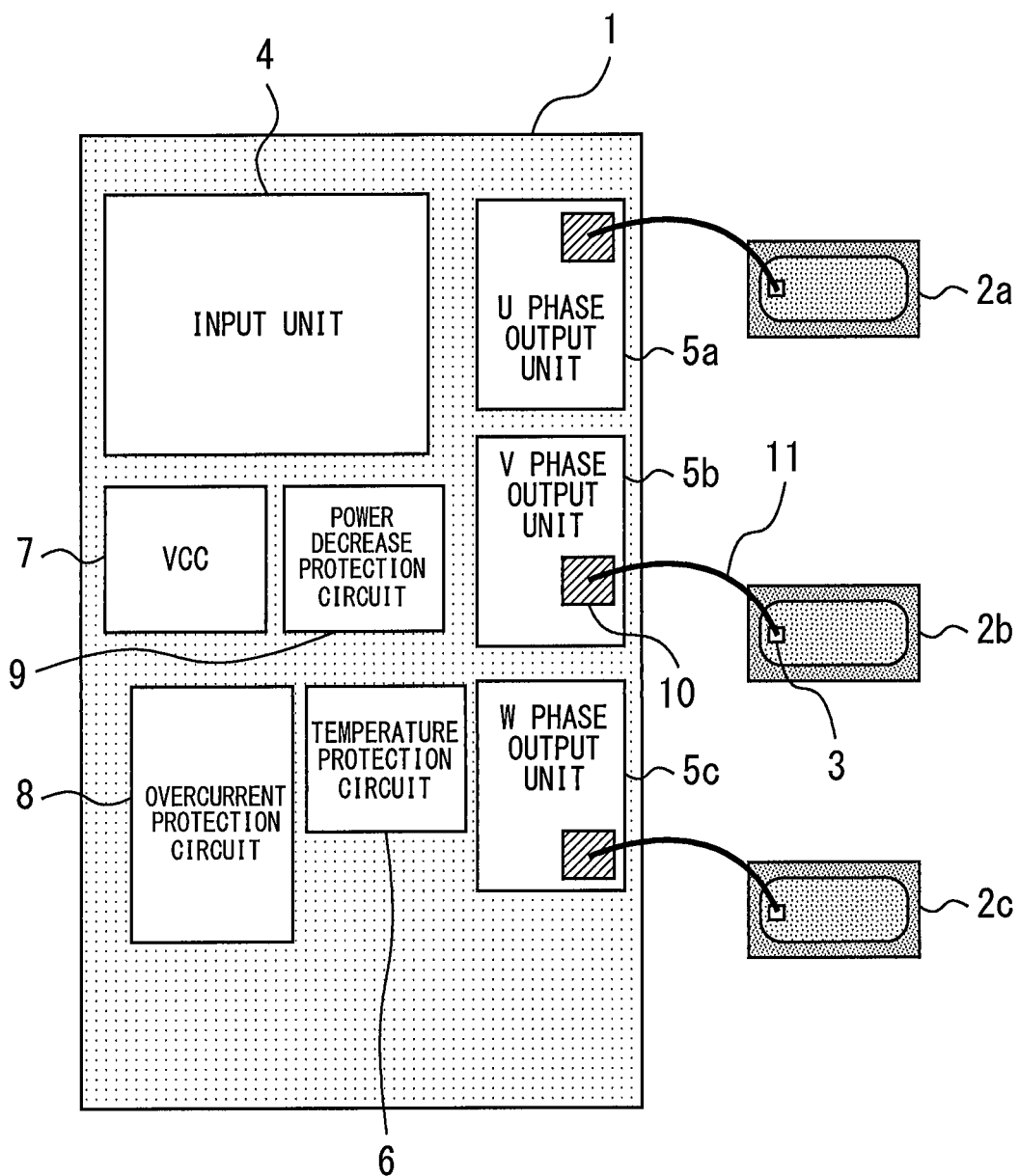
FIG. 1 is a plan view illustrating a semiconductor module according to a first embodiment.

FIG. 1 is a plan view illustrating a semiconductor module according to a first embodiment. The semiconductor module is an inverter module. A LVIC 1 used for low-pressure side drive drives a U-phase switching device 2a, a V-phase switching device 2b, and a W-phase switching device 2c. The switching devices 2a, 2b, and 2c are each, for example, an IGBT and include a gate pad 3. The LVIC 1 includes an input unit 4, output units 5a, 5b, and 5c, a temperature protection circuit 6, a power circuit 7, an overcurrent protection circuit 8, and a power decrease protection circuit 9. The U-phase output unit 5a, the V-phase output unit 5b, and the W-phase output unit 5c are provided for the U-phase, V-phase, and W-phase switching devices 2a, 2b, and 2c, respectively.

The input unit 4 transfers a control signal from the outside to the output units 5a, 5b, and 5c. The output units 5a, 5b, and 5c each include an output pad 10. The output pads 10 of the output units 5a, 5b, and 5c are connected with the gate pads 3 of the switching devices 2a, 2b, and 2c, respectively, through wires 11. The wires 11 are made of metal such as Au, Ag, or Cu. The output units 5a, 5b, and 5c output drive signals from the output pads 10 to the switching devices 2a, 2b, and 2c.

The temperature protection circuit 6 detects temperature and performs protection operation. The protection operation includes OT protection and VOT protection. In the OT protection, operation of the output units 5a, 5b, and 5c of the respective phases is stopped when the temperature of the temperature protection circuit 6 has steeply increased. In the VOT protection, the LVIC 1 does not perform self-protection, but an external microcomputer cuts off a control input signal when having sensed increase of output voltage VOT of the temperature protection circuit 6.

The power circuit 7 acquires power voltage from the outside and transfers the power voltage to each circuit block of the LVIC 1. The overcurrent protection circuit 8 cuts off the switching devices 2a, 2b, and 2c when overcurrent is sensed by an externally connected shunt resistor. The power decrease protection circuit 9 cuts off the switching devices 2a, 2b, and 2c when the power voltage has decreased.

Figure 2:
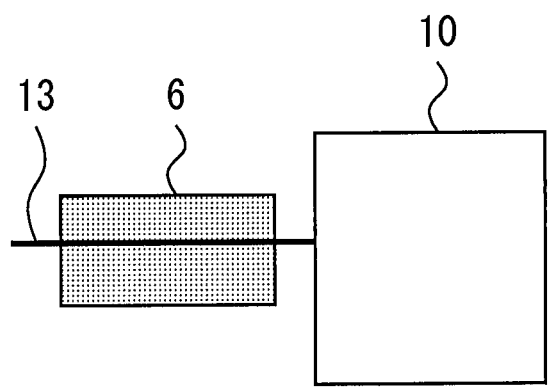
FIG. 2 is an enlarged plan view of each output pad and the temperature protection circuit according to the first embodiment.
Figure 3:
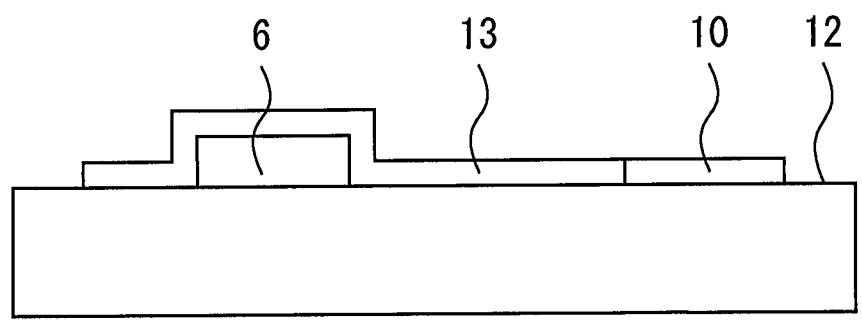
FIG. 3 is a cross-sectional view illustrating each output pad and the temperature protection circuit according to the first embodiment.

FIG. 2 is an enlarged plan view of each output pad and the temperature protection circuit according to the first embodiment. FIG. 3 is a cross-sectional view illustrating each output pad and the temperature protection circuit according to the first embodiment. Each output pad 10, the temperature protection circuit 6, and a heat conduction pattern 13 are provided on a semiconductor substrate 12 of the LVIC 1. The heat conduction pattern 13 is connected with the output pad 10, extends from the output pad 10 toward the temperature protection circuit 6, and overlaps the temperature protection circuit 6. An insulating film (not illustrated) is provided between the heat conduction pattern 13 and the temperature protection circuit 6. Accordingly, the heat conduction pattern 13 is not electrically but thermally connected with the temperature protection circuit 6. The heat conduction pattern 13 is formed by aluminum sputtering but may be formed of other metal as well.

Heat generated at the switching devices 2a, 2b, and 2c is conducted to the output pads 10 through the wires 11 and then conducted to the temperature protection circuit 6 through the heat conduction pattern 13. Each wire 11 contributes to not only electric conduction but also heat conduction, and thus preferably has a diameter of 200 to 500 μm.

Figure 4:
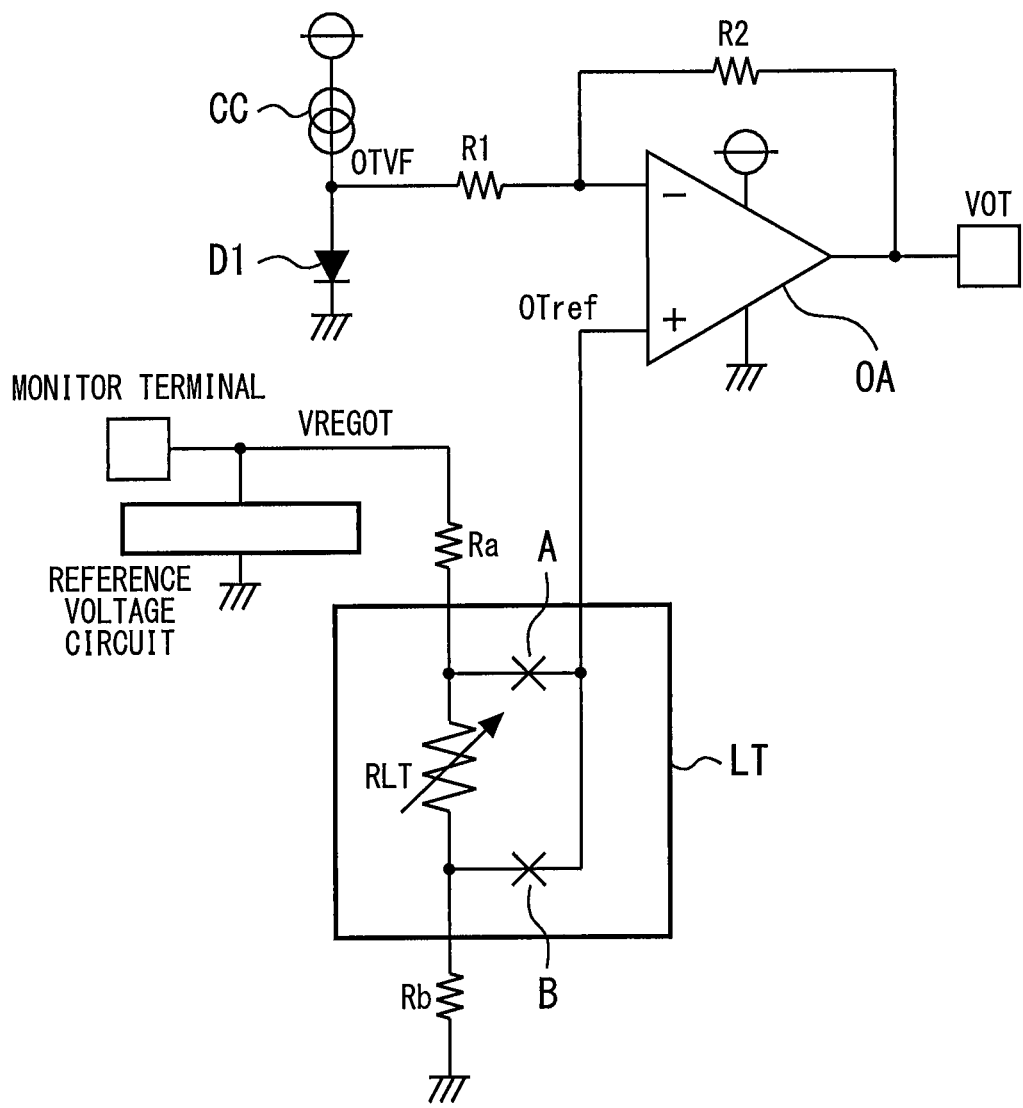
FIG. 4 is a circuit diagram illustrating the temperature protection circuit.

FIG. 4 is a circuit diagram illustrating the temperature protection circuit. A constant current circuit CC and a temperature sense diode D1 are connected in series between a DC power source and a ground point. One or a plurality of temperature sense diodes D1 may be connected in series. Anode voltage OTVF of the temperature sense diode D1 is input to a "−" input terminal of an operational amplifier OA through a resistor R1. A resistor R2 is connected between an output terminal of the operational amplifier OA and the "−" input terminal. A resistor Ra, a laser trimming circuit LT, and a resistor Rb are connected in series between a reference voltage VREGOT of a reference voltage circuit and the ground point. Output voltage OTref of the laser trimming circuit LT is input to a "+" input terminal of the operational amplifier OA.

The operational amplifier OA inversely amplifies the anode voltage OTVF of the temperature sense diode D1 and outputs the output voltage VOT, which is expressed by Expression (1), as an analog temperature signal.

$$VOT = OTref \cdot (1 + R2/R1) - OTVF \cdot R2/R1 \quad (1)$$

As the temperature of the temperature protection circuit 6 increases, forward voltage of the temperature sense diode D1 decreases and the output voltage VOT of the operational amplifier OA increases.

Figure 5:
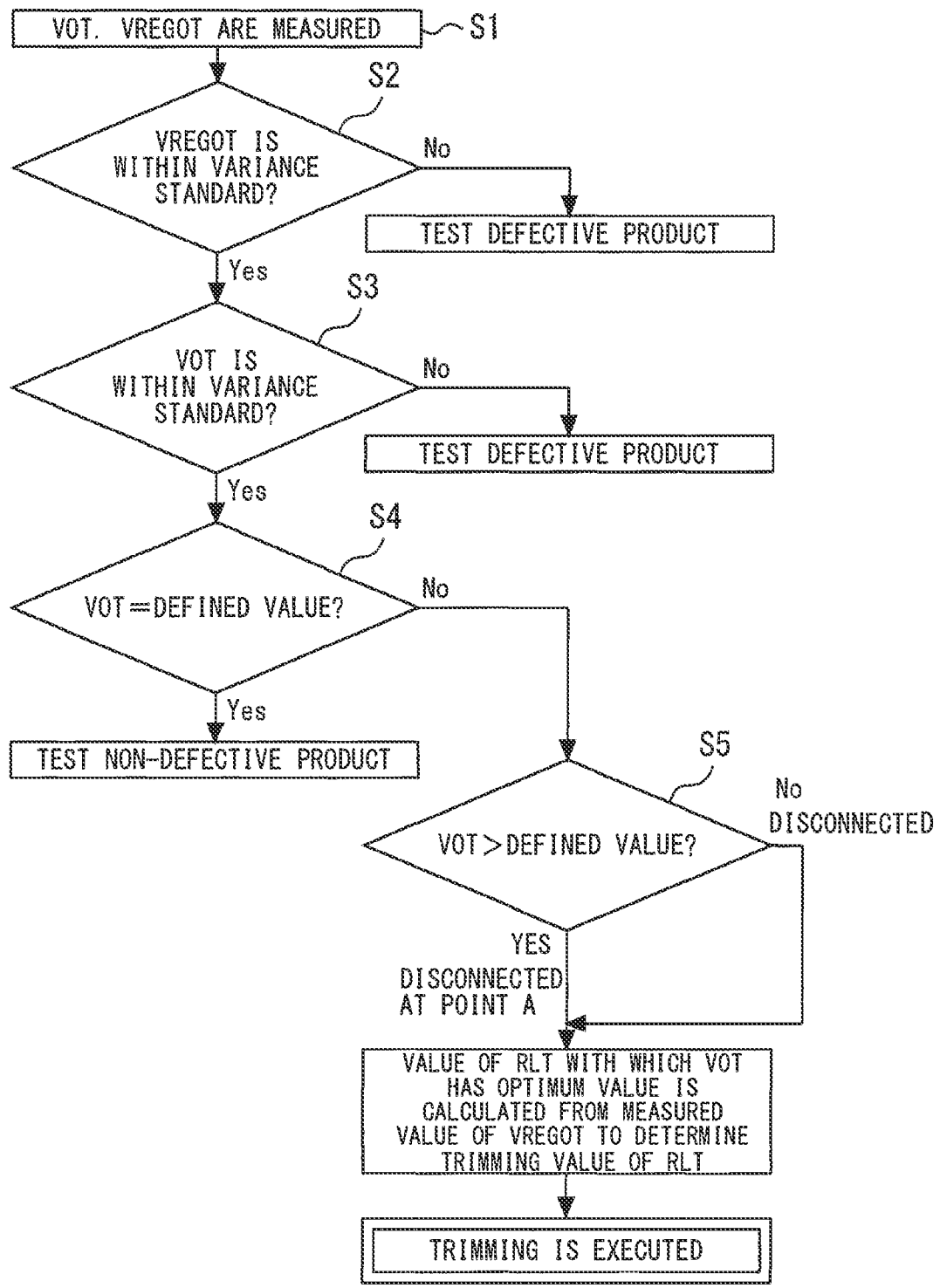
FIG. 5 is a flowchart of laser trimming operation.

The anode voltage OTVF and the reference voltage VREGOT vary due to device variance or the like. Thus, the laser trimming circuit LT corrects the variance of the anode voltage OTVF and the reference voltage VREGOT as described below. FIG. 5 is a flowchart of laser trimming operation.

First, the output voltage VOT and the reference voltage VREGOT are measured (step S1). It is checked whether the reference voltage VREGOT is within a variance standard (step S2), and when the reference voltage VREGOT is out of the standard, it is determined that the module is a test defective product. It is checked whether the output voltage VOT is within a variance standard (step S3), and when the output voltage VOT is out of the standard, it is determined that the module is a test defective product. It is checked whether the output voltage VOT is a defined value (step S4), and when the output voltage VOT is the defined value, it is determined that the module is a test non-defective product. Then, the laser trimming circuit LT is connected at each of point A and point B.

The output voltage OTref in which the laser trimming circuit LT is connected at Point A and Point B is given by Expression (2).

$$OTref = VREGOT \cdot Rb / (Ra + Rb) \quad (2)$$

Subsequently, it is checked whether the output voltage VOT is larger than the defined value (step S5), and when the output voltage VOT is larger, the laser trimming circuit LT is disconnected at point A. In this case, the output voltage OTref is given by Expression (3). Variable resistance RLT with which optimum output voltage VOT is obtained is determined by Expressions (1) and (3).

$$OTref = VREGOT \cdot Rb / (Ra + RLT + Rb) \quad (3)$$

When the output voltage VOT is smaller than the defined value, the laser trimming circuit LT is disconnected at Point B. In this case, the output voltage OTref is given by Expression (4). The variable resistance RLT with which optimum output voltage VOT is obtained is determined by Expressions (1) and (4).

$$OTref = VREGOT \cdot (RLT + Rb) / (Ra + RLT + Rb) \quad (4)$$

In this manner, the resistance value of the variable resistance RLT with which the output voltage VOT has an optimum value is calculated from the measured value of the reference voltage VREGOT to determine a trimming value of the variable resistance RLT, thereby executing trimming.

As described above, in the present embodiment, the heat conduction pattern 13 extending from each output pad 10 toward the temperature protection circuit 6 is provided to conduct heat generated at the switching devices 2a, 2b, and 2c to the temperature protection circuit 6. Accordingly, the temperature Tlvic of the temperature protection circuit 6 follows transient change of the temperature Tj of each of the switching devices 2a, 2b, and 2c, and as a result, the temperature protection circuit 6 can accurately sense abrupt increase of the temperature of the switching devices 2a, 2b, and 2c. Thus, it is possible to achieve sufficient temperature protection and prevent breakdown of the semiconductor module even in an operation mode, such as motor lock operation or short-circuit operation, in which the temperature of the switching devices 2a, 2b, and 2c steeply increases.

In addition, temperature protection setting in a customer side system can be simplified when the semiconductor module according to the present embodiment is incorporated in various kinds of products for consumer usage, industrial usage, and the like. Moreover, the present embodiment can be achieved with an existing inverter module configuration, and thus the accuracy of temperature detection of the LVIC mounted on an inverter module can be improved at low cost.

Figure 6:
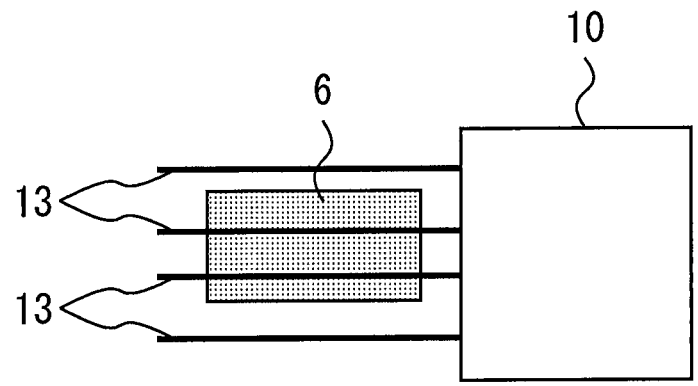
FIG. 6 is a plan view illustrating a first modification of the heat conduction pattern according to the first embodiment.

FIG. 6 is a plan view illustrating a first modification of the heat conduction pattern according to the first embodiment. Two straight heat conduction patterns 13 overlap the temperature protection circuit 6, and other two straight heat conduction patterns 13 are provided on sides of the temperature protection circuit 6. When the plurality of heat conduction patterns 13 are provided in this manner, the performance of heat conduction to the temperature protection circuit 6 is further improved.

Figure 7:
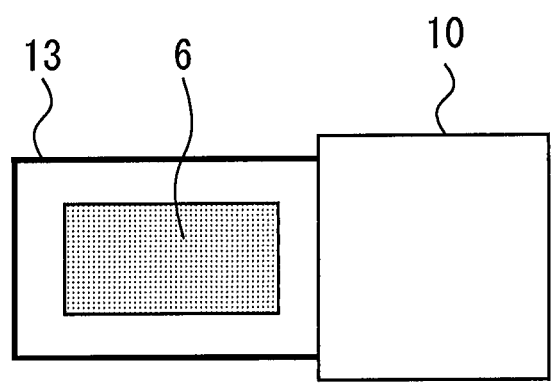
FIG. 7 is a plan view illustrating a second modification of the heat conduction pattern according to the first embodiment.

FIG. 7 is a plan view illustrating a second modification of the heat conduction pattern according to the first embodiment. A heat conduction pattern 13 surrounds the temperature protection circuit 6. The heat conduction pattern 13 and the temperature protection circuit 6 are separated from each other, and heat is conducted from the heat conduction pattern 13 to the temperature protection circuit 6 through the semiconductor substrate 12. The heat conduction pattern 13 may contact a side surface of the temperature protection circuit 6 through an insulating film. With such a heat conduction pattern 13 as well, heat generated at the switching devices 2a, 2b, and 2c can be conducted to the temperature protection circuit 6.

Figure 8:
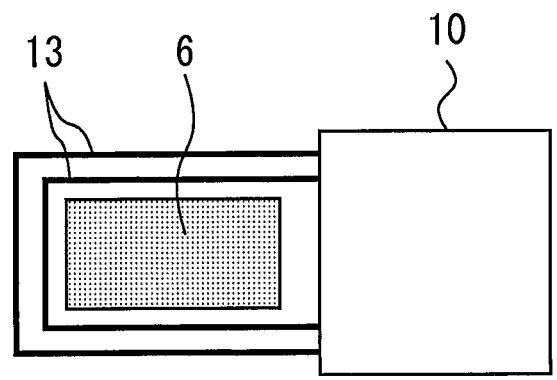
FIG. 8 is a plan view illustrating a third modification of the heat conduction pattern according to the first embodiment.

FIG. 8 is a plan view illustrating a third modification of the heat conduction pattern according to the first embodiment. Two heat conduction patterns 13 surround the temperature protection circuit 6. When the plurality of heat conduction patterns 13 are provided in this manner, the performance of heat conduction to the temperature protection circuit 6 is further improved.

Each heat conduction pattern 13 is provided close to the entire temperature protection circuit 6. However, in the configuration of the temperature protection circuit 6 in FIG. 4, device temperatures and characteristic values of the temperature sense diode D1, the laser trimming circuit LT, and the resistors Ra and Rb change with change of the temperature of the module, which contributes to the output voltage VOT. Thus, the heat conduction pattern 13 is preferably provided close to these parts.

Second Embodiment

Figure 9:
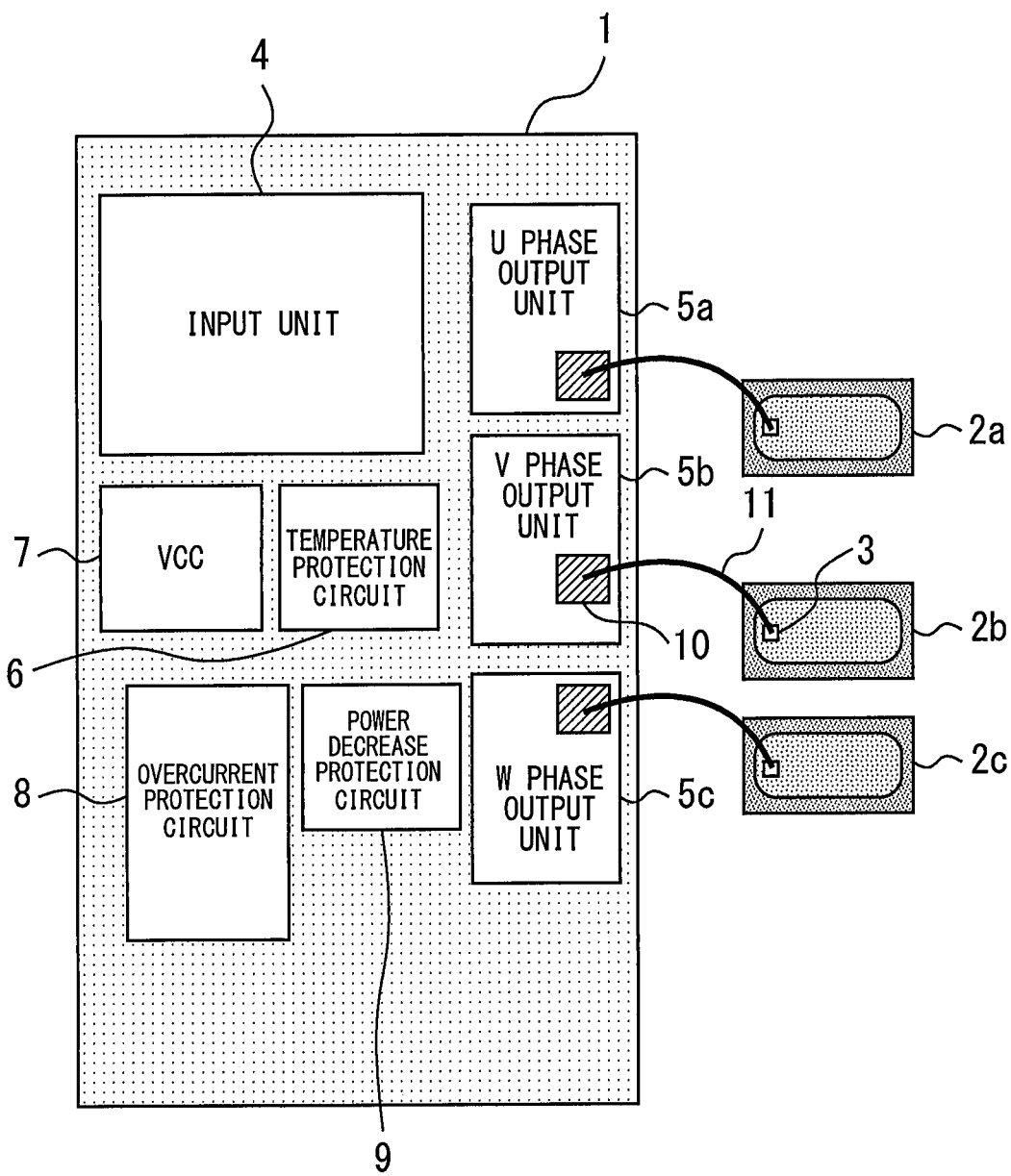
FIG. 9 is a plan view illustrating a semiconductor module according to a second embodiment.

FIG. 9 is a plan view illustrating a semiconductor module according to a second embodiment. The temperature protection circuit 6 is positioned closer to the output pads 10 of the output units 5a, 5b, and 5c compared to other circuits such as the power decrease protection circuit 9 included in the LVIC 1. Accordingly, the performance of heat conduction to the temperature protection circuit 6 is further improved, and thus abrupt increase of the temperature Tj of the switching devices 2a, 2b, and 2c can be more accurately sensed.

Third Embodiment

Figure 10:
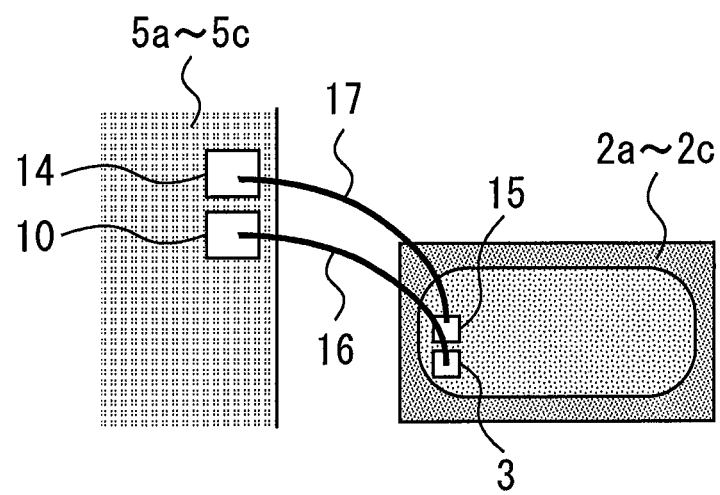
FIG. 10 is a plan view illustrating each switching device and the corresponding output unit according to a third embodiment.

FIG. 10 is a plan view illustrating each switching device and the corresponding output unit according to a third embodiment. A dummy pad 14 is provided next to the output pad 10 of the output unit 5a, 5b, or 5c. A dummy pad 15 is provided next to the gate pad 3 of the switching device 2a, 2b, or 2c.

The output pads 10 of the output units 5a, 5b, or 5c are connected with the gate pads 3 of the switching devices 2a, 2b, or 2c through electrically conductive wires 16. The dummy pad 14 of the output unit 5a, 5b, or 5c is connected with the dummy pad 15 of the switching device 2a, 2b, or 2c through a thermally conductive wire 17.

Figure 11:
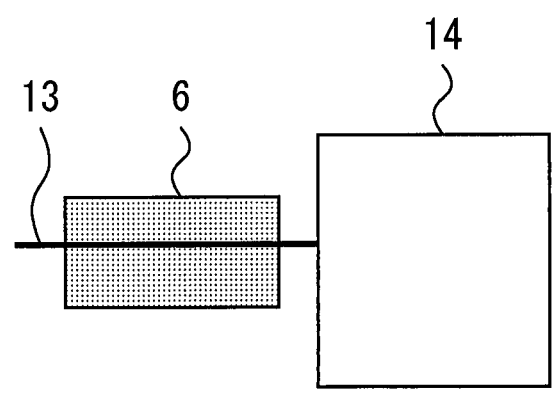
FIG. 11 is an enlarged plan view of each output pad and the temperature protection circuit according to the third embodiment.

FIG. 11 is an enlarged plan view of each output pad and the temperature protection circuit according to the third embodiment. The heat conduction pattern 13 is connected with the dummy pad 14. The heat conduction pattern 13 extends from the dummy pad 14 toward the temperature protection circuit 6 and conducts heat generated at each of the switching devices 2a, 2b, and 2c to the temperature protection circuit 6. The other configuration is same as those of the first and second embodiments.

With the configuration according to the present embodiment as well, similarly to the first and second embodiments 1 and 2, the temperature Tlvic of the temperature protection circuit 6 follows transient change of the temperature Tj of the switching devices 2a, 2b, and 2c. Accordingly, the temperature protection circuit 6 can accurately sense abrupt increase of the temperature of the switching devices 2a, 2b, and 2c. Thus, it is possible to achieve sufficient temperature protection and prevent breakdown of the semiconductor module in an operation mode, such as the motor lock operation or the short-circuit operation, in which the temperature of the switching devices 2a, 2b, and 2c steeply increases.

To perform efficient heat conduction, it is preferable that the diameter of each thermally conductive wire 17 is larger than the diameter of the corresponding electrically conductive wire 16 and is, for example, 200 to 500 μm. The thermally conductive wire 17 and the electrically conductive wire 16 are made of metal such as Au, Ag, or Cu. However, the material of the thermally conductive wire 17 may be a non-electrically conductive member such as highly thermally conductive fine ceramics including AN as a representative example. To perform further efficient heat conduction, the heat conduction pattern 13 is preferably connected with not only each dummy pad 14 but also each output pad 10.

Fourth Embodiment

In the present embodiment, the semiconductor module according to any of the first to third embodiments described above is applied to an electrical power conversion device. The present disclosure is not limited to a particular electrical power conversion device, but the following description is made with a case in which the present disclosure is applied to a three-phase inverter.

Figure 12:
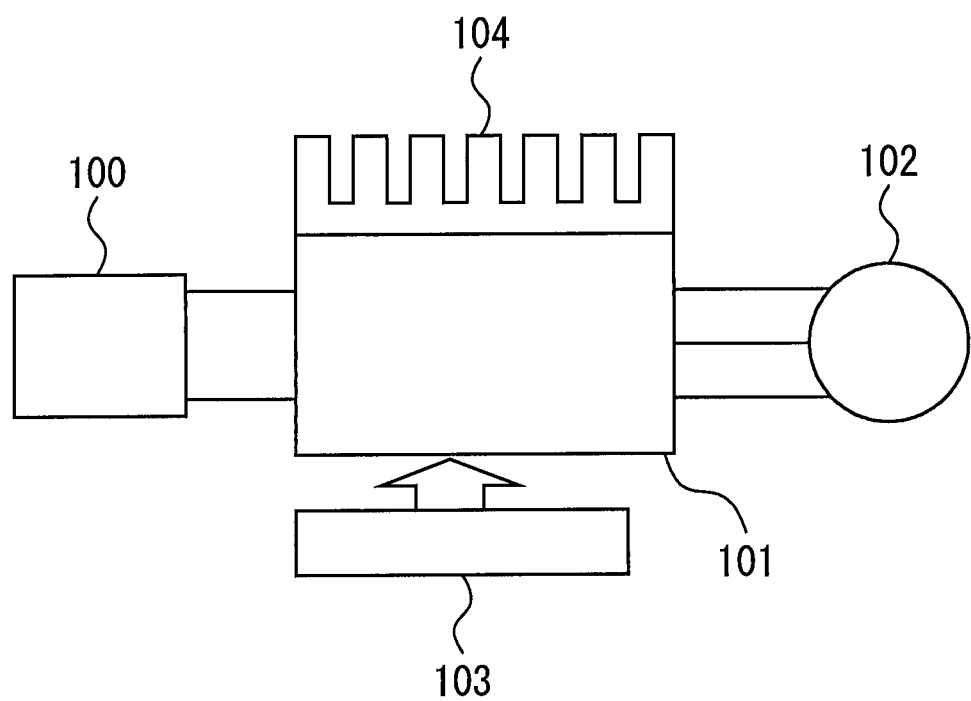
FIG. 12 is a block diagram illustrating the configuration of an electrical power conversion device to which the semiconductor module according to the third embodiment is applied.

FIG. 12 is a block diagram illustrating the configuration of an electrical power conversion device to which the semiconductor module according to the third embodiment is applied.

The electrical power conversion device includes a power source 100, a semiconductor module 101 for electrical power conversion, an induction load 102, a control circuit 103, and a heat-releasing fin 104. The power source 100 is a direct-current power source and supplies direct-current power to the semiconductor module 101. The power source 100 may be of any kind and may be, for example, a direct-current system, a solar battery, or a storage battery or may be a rectification circuit or an AC/DC converter connected with an alternating-current system. Alternatively, the power source 100 may be a DC/DC converter configured to convert direct-current power output from a direct-current system into predetermined electrical power.

The semiconductor module 101 is a three-phase inverter connected between the power source 100 and the induction load 102. The semiconductor module 101 converts direct-current power supplied from the power source 100 into alternating-current power and supplies the alternating-current power to the induction load 102.

The induction load 102 is a three-phase electric motor driven by the alternating-current power supplied from the semiconductor module for electrical power conversion. The induction load 102 is not limited to particular usage but is an electric motor mounted on various electric instruments, and used as an electric motor for, for example, a hybrid automobile, an electric vehicle, a railway vehicle, an elevator, or an air conditioner.

Details of the semiconductor module 101 will be described below. The semiconductor module 101 includes a switching device, a freewheeling diode, and an IC for control thereof. When the switching device is switched, direct-current power supplied from the power source 100 is converted into the alternating-current power and then supplied to the induction load 102. Although the semiconductor module 101 may have various kinds of specific circuit configurations, the semiconductor module 101 according to the present embodiment is a two-level three-phase full-bridge circuit and may be constituted by six switching devices and six freewheeling diodes connected in antiparallel with the respective switching devices. The six switching devices form upper-lower arms through series connection of each of two switching devices, and each upper-lower arm provides the corresponding phase (U, V, or W phase) of the full-bridge circuit. Output terminals of the respective upper-lower arms, in other words, three output terminals of the semiconductor module 101 are connected with the induction load 102. The semiconductor module according to any of the first to third embodiments described above is applied as the semiconductor module 101.

The control IC included in the semiconductor module 101 generates a drive signal that drives each switching device included in the semiconductor module 101 in the same manner. Specifically, the drive signal for turning on the switching device or the drive signal for turning off the switching device is output to a control electrode of each switching device in accordance with a control signal from the control circuit 103 to be described later. When the switching device is maintained on, the drive signal is a voltage signal ("on" signal) equal to or higher than threshold voltage of the switching device. When the switching device is maintained off, the drive signal is a voltage signal ("off" signal) equal to or lower than the threshold voltage of the switching device.

The control circuit 103 controls each switching device of the semiconductor module 101 so that desired electrical power is supplied to the induction load 102. Specifically, a time ("on" time) at which each switching device of the semiconductor module 101 is to be turned on is calculated based on electrical power to be supplied to the induction load 102. For example, the semiconductor module 101 can be controlled by PWM control that modulates the "on" time of each switching device in accordance with voltage to be output. A control command (control signal) is output to the control IC included in the semiconductor module 101 so that the "on" signal is output to a switching device to be turned on and the "off" signal is output to a switching device to be turned off at each time point. The control IC outputs the "on" signal or the "off" signal as the drive signal to the control electrode of each switching device in accordance with the control signal.

The heat-releasing fin 104 discharges heat generated by drive of the semiconductor module 101 to the outside. Specifically, joining grease is applied between the heat-releasing fin 104 and the semiconductor module 101, heat generated by the semiconductor module 101 is discharged to the outside through heat conduction of the heat-releasing fin 104 and the joining grease. The heat-releasing fin 104 may be attached to one or both side surfaces of the semiconductor module for electrical power conversion.

Since the semiconductor module according to any of the first to third embodiments is used as the semiconductor module 101 in the electrical power conversion device according to the present embodiment, the accuracy of a temperature protection function of the electrical power conversion device can be improved.

Although the present embodiment describes the example in which the present disclosure is applied to a two-level three-phase inverter, the present disclosure is not limited thereto and the present disclosure may be applied to various kinds of electrical power conversion devices. The electrical power conversion device according to the present embodiment is a two-level electrical power conversion device but may be a three-level or multi-level electrical power conversion device, or the present invention may be applied to a single-phase inverter when electrical power is supplied to a single-phase load. Alternatively, the present disclosure may be applied to a DC/DC converter or an AC/DC converter when electrical power is supplied to a direct-current load or the like.

The electrical power conversion device to which the present disclosure is applied is not limited to the above-described case in which a load is an electric motor. For example, the electrical power conversion device may be used as a power device of an electrical discharging machine, a lasering machine, an induction heating cooking device, or a non-contact power supply system, or may be used as a power conditioner of a solar power generation system, an electrical storage system, or the like.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2020-215215, filed on Dec. 24, 2020 including specification, claims, drawings and summary, on which the convention priority of the present application is based, is incorporated herein by reference in its entirety.

The invention claimed is:

1. A semiconductor module comprising:
   a switching device including a gate pad;
   an output unit including an output pad connected with the gate pad of the switching device through a wire and outputting a drive signal from the output pad to the switching device;

a temperature protection circuit detecting temperature and performing protection operation; and a heat conduction pattern connected with the output pad, extending from the output pad toward the temperature protection circuit, and conducting heat generated at the switching device to the temperature protection circuit.

2. The semiconductor module according to claim 1, wherein the heat conduction pattern overlaps the temperature protection circuit.

3. The semiconductor module according to claim 1, wherein the heat conduction pattern surrounds the temperature protection circuit.

4. The semiconductor module according to claim 1, wherein the heat conduction pattern includes a plurality of heat conduction patterns.

5. The semiconductor module according to claim 1, wherein the temperature protection circuit is positioned closer to the output pad compared to other circuits.

6. The semiconductor module according to claim 1, wherein the wire has a diameter of 200 to 500 µm.

* * * * *